United States Patent [19]

Ryan

[11] 4,284,960
[45] Aug. 18, 1981

[54] PHOTO-FEEDBACK PREAMPLIFIER CIRCUIT

[75] Inventor: John O. Ryan, Cupertino, Calif.

[73] Assignee: Ampex Corporation, Redwood City, Calif.

[21] Appl. No.: 96,727

[22] Filed: Nov. 23, 1979

[51] Int. Cl.³ .......................... H03F 1/34; H03F 3/16
[52] U.S. Cl. .................................. 330/300; 330/293; 330/308
[58] Field of Search ................. 330/59, 277, 293, 300, 330/308, 311; 250/214 A

[56] References Cited

U.S. PATENT DOCUMENTS

| 3,611,173 | 10/1971 | Goulding et al. ...................... 330/59 |
| 4,053,847 | 10/1977 | Kumahara et al. .................. 330/277 |

OTHER PUBLICATIONS

Koeblitz, "Photocell in Feedback Circuit Regulates Output," *Electronic Design*, Jun. 21, 1963, pp. 76, 77.
Galetto et al., "Optical Closed-Loop Analog Amplifier and Detector," *IBM Tech. Disclosure Bulletin*, pp. 2848–2849, Mar. 1975.
Lyk, "A Low-Noise Preamplifier for Semiconductors with Optoelectronic Feedback," *Instruments and Experimental Techniques*, vol. 18, No. 2, PT.², pp. 491–492, Mar.–Apr. 1975.

*Primary Examiner*—James B. Mullins
*Attorney, Agent, or Firm*—Robert G. Clay; George B. Almeida

[57] ABSTRACT

A light emitting diode is modulated by the output signal of a F.E.T. amplifier, and the resulting light signal is fed back to the amplifier input via an optical fiber and a light detecting photo diode. Thus, current feedback is achieved with very flat frequency response over a full frequency band by modulating a light emitting diode with the preamplifier output signal, reconverting the resultant radiation to an electrical signal, which is then fed back to the preamplifier input.

1 Claim, 2 Drawing Figures

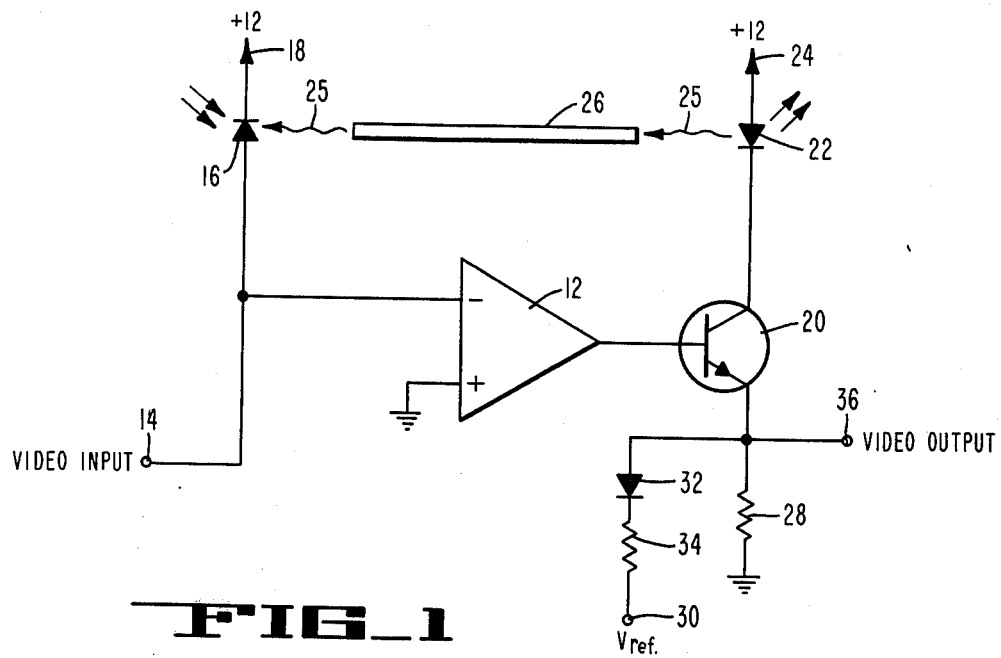
FIG_1
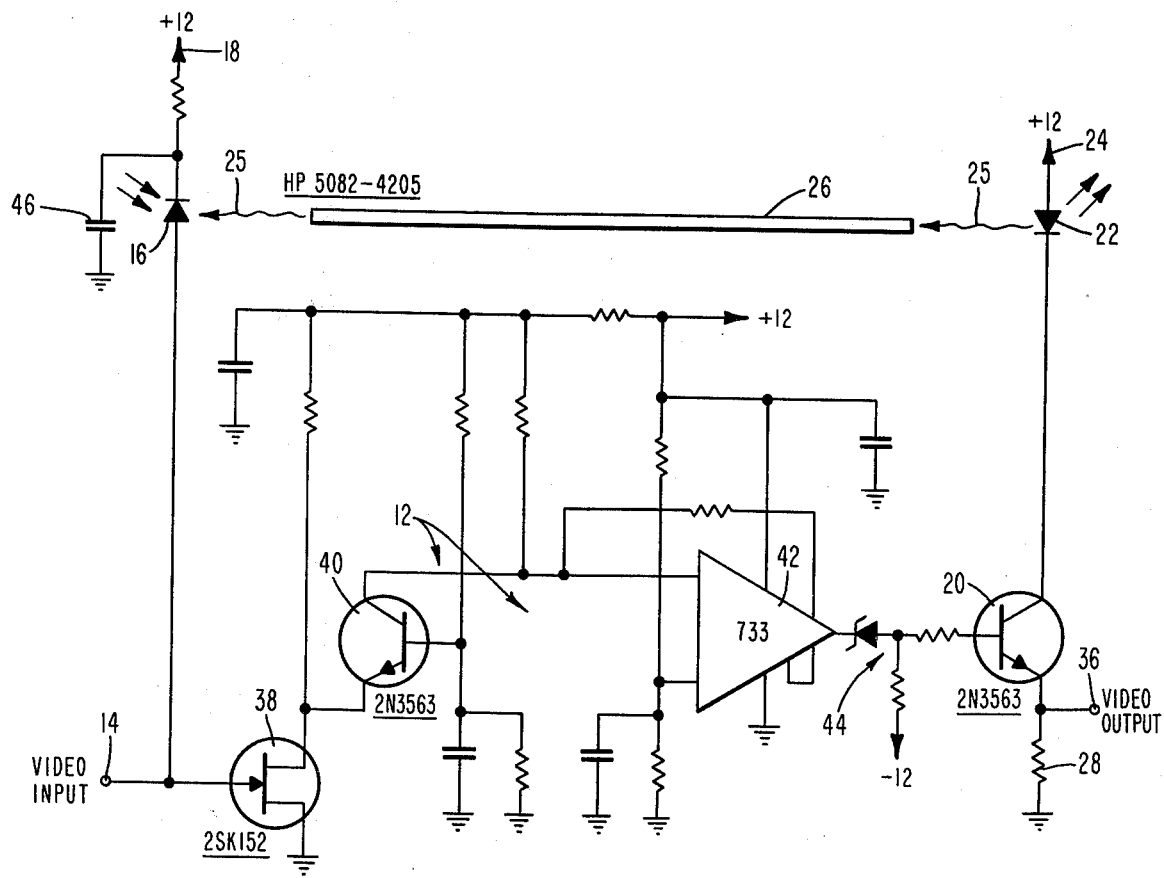
FIG_2

PHOTO-FEEDBACK PREAMPLIFIER CIRCUIT

BACKGROUND OF THE INVENTION

1. Field

The invention relates to preamplifiers and, particularly, to a camera tube preamplifier circuit employing an optical feedback path.

2. Prior Art

One of the basic problems in designing a preamplifier for, for example, the front end of a camera, is how to control the frequency response thereof or, more precisely, how to assess the frequency response. Ideally, the signal current supplied by the image pickup tube (i.e., plumbicon, vidicon, etc.) should be amplified or converted into a voltage without any loss of frequency response. For example, the response should be flat from d.c. to of the order of five or six megahertz (MHz). The problem lies not in making the response flat, but in determining when in fact the response is flat. That is, in order to assess the frequency response of the preamplifier, it must be swept through a range of operating frequencies, which is very difficult to do without disturbing the operating characteristics of the preamplifier, since applying a test sweep to its input inherently distorts the frequency response curve.

The above problem of classic feedback amplifiers for pickup tubes is caused, in part, in the interests of minimizing noise, by the required use of large value load resistors ranging from one-half million to two or three million ohms resistance. The large value load resistors, in turn, have very appreciable self-capacitances as well as distributed capacitances to ground, which cause the feedback to vary with variations in frequency. Furthermore, these parasitic capacitances are not predictable so it is necessary to provide adjustable compensation within the preamplifier. However, in order to make these adjustments, as mentioned above, it is necessary to sweep the preamplifier over the frequency range of interest. Any attempt to do this usually interferes with the characteristics of the preamplifier, thus invalidating the adjustments.

A further problem with classic preamplifiers arises with the use of anti-comet tail type tubes. When discharging highlights, these tubes can generate signal currents as high as 80 microamperes, thus developing 80 volt pulses in a preamplifier using a one million ohm feedback resistance. It is essential that the preamplifier be able to accommodate these pulses without saturating, otherwise excessive recovery times are inevitable. Thus, high voltage supplies are required; and the preamplifier power consumption can become appreciable.

A further disadvantage of classic preamplifiers is the fact that their output d.c. voltage corresponding to zero signal current (black level) is not well defined and varies with temperature. This results in the need for some form of black level clamp to accurately reestablish black level prior to blanking.

SUMMARY OF THE INVENTION

The present invention overcomes the above-mentioned disadvantages of the prior art preamplifiers by providing an improved preamplifier circuit for use, for example, in camera tube systems. In general, the circuit is applicable in situations wherein current is converted into voltage over a wide bandwidth with low noise.

More particularly, the preamplifier employs a field effect transistor (F.E.T.) amplifier with input and output terminals, wherein current feedback is achieved by modulating a light emitting diode (LED) in response to the F.E.T. amplifier output signal via an output transistor, and by feeding back the resulting light signal to the input terminal via an optical fiber and a light detecting photodiode. The optical feedback path has a very flat frequency response over the full bandwidth, which circumvents the response problems inherent in the high resistance feedback type of preamplifier.

When used with anti-comet tail type tubes, a reference voltage is coupled to the output terminal via a diode to clip the output signal without breaking the feedback signal. The signal voltages in the preamplifier circuit need never exceed a few volts, whereby only low voltage supplies are required.

Thus, it is an object of the invention to provide a current feedback preamplifier which has a known flat frequency response with low noise over its full bandwidth.

A further object is to provide a preamplifier with an optical current feedback path which inherently has a flat frequency response and is immune to exterior noise pickup.

Another object of the invention is to provide a current feedback preamplifier for anti-comet tail type pickup tubes and circuits, which can readily handle the high current level anti-comet tail pulses with a low voltage power supply.

A further object of the invention is to provide a current feedback preamplifier which produces an accurately predictable d.c. output voltage corresponding to zero signal current (i.e., black level), thus eliminating the need for a black level clamp following the preamplifier.

BRIEF DESCRIPTION OF THE DRAWINGS

FIG. 1 is a simplified schematic diagram depicting the invention combination.

FIG. 2 is a schematic diagram of one implementation of the circuit of FIG. 1.

DESCRIPTION

Although the invention is described herein in use with a camera tube system, it is to be understood that the circuit may be used in other applications wherein it is desirable to convert current into voltage over a wide bandwidth with low noise, with well defined frequency response, low offset voltage and wherein low voltage operation is desirable.

To this end, a field effect transistor (F.E.T.) input amplifier 12 is coupled at its negative input to the input signal from a camera tube target (not shown) via input terminal 14. The negative input also is coupled to the anode of a (PIN) photodiode 16. The cathode of the photodiode 16 is coupled to a positive voltage supply (e.g., +12 volts) as at 18. The positive input of the F.E.T. amplifier 12 is coupled to ground.

The output of the F.E.T. amplifier 12 is coupled to the base of an output transistor 20, whose collector is coupled to the cathode of a light emitting diode (LED) 22. The anode of the latter is coupled to a positive voltage supply (e.g., +12 volts) as at 24. A light radiation signal 25, generated by the LED 22 is coupled to the photodiode 16 via an optical fiber 26.

The emitter of transistor 20 is coupled to ground via a load resistor 28, to a reference voltage supply 30 via a clipping diode 32 and resistor 34, and to a video output terminal 36.

In operation, current feedback is achieved by modulating the LED 22 with the output signal supplied via the collector of the transistor 20, and by coupling the resulting light radiation signal 25 to the photodiode 16 via the optical fiber 26. The photodiode 16 is coupled to the input of the F.E.T. amplifier 12, along with the incoming signal current input thereto on intput terminal 14.

The output signal is clipped by the diode 32 and the reference voltage 30 to a selected clipping level determined thereby. The resistor 34 determines the softness of the clip.

FIG. 2 is a more detailed schematic diagram of the circuit of FIG. 1, wherein like components are identified by similar numerals. Thus, the video input 14 is fed to a field effect transistor (F.E.T.) 38 and, thence, to an input transistor 40, to define a cascode network which reduces the Miller effect. The output from the input transistor 40 is fed to an operational amplifier with feedback 42, wherein the components 38, 40, 42 define the F.E.T. amplifier 12 of FIG. 1. The F.E.T. 38 is chosen for very low noise performance. The output of the operational amplifier 42 is d.c. level shifted towards ground potential, only because of its peculiar d.c. characteristics, via zener diode/resistor arrangement 44, and is fed to the output transistor 20. A capacitor 46 prevents any power supply disturbance at the cathode of the photodiode 16 from generating crosstalk in the circuit.

The optical feedback path has a very flat frequency response, e.g., the LED 22 has a flat response from d.c. to at least 20 MHz; and the photodiode 16 is flat well into the megaHertz region. Further, the optical feedback path is not susceptible to noise pickup since there are no paths to ground between the output of the amplifier 12 and the feedback input point thereof, and as long as care is taken not to allow extraneous light into the optical fiber 26.

Anti-comet tail type of pulses of large magnitude are readily handled, with a low voltage power supply, since the relatively small load resistor 28 allows the use of a low output voltage during normal tube operation, e.g., 10 milli volts. During the presence of an anti-comet tail type pulse of, for example, 100 times larger signal, the output voltage generated is only of the order of 1 volt, which is within the range of a low voltage preamplifier design.

In addition, the use of the optical feedback path allows the accurate prediction of the black level, i.e., a zero output voltage level, since a zero video level (black level) at input 14 always generates a corresponding zero video level at the preamplifier output 36. More particularly, there is a zero signal from the photodiode 16 when there is a zero voltage input at 14, causing zero collector current in output transistor 20 and no signal from the LED 22, no light signal in the optical fiber 26, and zero output voltage, (i.e., a predictable black level) on the output terminal 36.

I claim:

1. A video camera preamplifier circuit employing a low voltage supply, for generating an output video signal in response to an input video signal, wherein the input video signal may experience large overload input signals due to excessive highlights, the circuit including a field effect transistor amplifier means coupled to receive the input video signal and optoelectronic feedback loop means operatively coupling the output video signal back to the input video signal, wherein the feedback loop means includes light emitting diode means, light detecting photodiode means and optical fiber means coupled between the latter two means, the circuit comprising the combination of;

an output transistor having base, emitter and collector electrodes, and coupled at its base to the output of the field effect transistor amplifier means;

a load resistor coupled from the emitter of the output transistor to ground;

wherein the light emitting diode means of the loop means is coupled directly to the collector of the output transistor at its cathode and to a positive voltage source at its anode such that the absence of an input signal provides no current flow in the light emitting diode means and no current flow thru the load resistor, to establish a zero output video voltage corresponding to a video black level; and clipping means including a diode coupled from the emitter of the output transistor to a reference voltage for selectively clipping the output video signal upon occurrence of the large overload input signals without breaking the continuity of the optoelectronic feedback loop.

* * * * *